(12) United States Patent
Sudo et al.

(10) Patent No.: US 9,187,357 B2
(45) Date of Patent: Nov. 17, 2015

(54) VITREOUS SILICA CRUCIBLE HAVING OUTER, INTERMEDIATE, AND INNER LAYERS

(75) Inventors: Toshiaki Sudo, Akita (JP); Masaru Sato, Akita (JP)

(73) Assignee: Japan Super Quartz Corporation, Akita-shi (JP)

( * ) Notice: Subject to any disclaimer, the term of this patent is extended or adjusted under 35 U.S.C. 154(b) by 700 days.

(21) Appl. No.: 13/387,384

(22) PCT Filed: Jul. 28, 2010

(86) PCT No.: PCT/JP2010/062682
§ 371 (c)(1),
(2), (4) Date: Jan. 27, 2012

(87) PCT Pub. No.: WO2011/013695
PCT Pub. Date: Feb. 3, 2011

(65) Prior Publication Data
US 2012/0137965 A1 Jun. 7, 2012

(30) Foreign Application Priority Data

Jul. 31, 2009 (JP) .................................. 2009-179536

(51) Int. Cl.
*C30B 15/10* (2006.01)
*C03B 19/09* (2006.01)
(Continued)

(52) U.S. Cl.
CPC ............... *C03B 19/095* (2013.01); *C30B 15/10* (2013.01); *C30B 29/06* (2013.01); *C30B 35/002* (2013.01); *Y10T 117/1032* (2015.01)

(58) Field of Classification Search
CPC ...... C30B 15/00; C30B 15/10; Y10T 117/00; Y10T 117/10; Y10T 117/1024; Y10T 117/1032

USPC .................. 117/200, 206, 208, 928, 931, 932
See application file for complete search history.

(56) References Cited

U.S. PATENT DOCUMENTS 5,976,247 A  11/1999  Hansen
7,226,508 B2  6/2007  Korus
(Continued)

FOREIGN PATENT DOCUMENTS

EP    1 375 702 A2    1/2004
JP    09-110590 A    4/1997
(Continued)

OTHER PUBLICATIONS

Extended European Search Report mailed May 21, 2012, issued in corresponding European Application No. EP 10 80 4441, filed Jul. 28, 2010, 5 pages.
(Continued)

*Primary Examiner* — Kenneth A Bratland, Jr.
(74) *Attorney, Agent, or Firm* — Christensen O'Connor Johnson Kindness PLLC

(57) ABSTRACT

A vitreous silica crucible has high strength at high temperature, and allows easy taking-out from a susceptor after completion of pulling. The vitreous silica crucible includes a vitreous silica outer layer provided on the outer surface side of the crucible, a vitreous silica inner layer provided on the inner surface side of the crucible, and an vitreous silica intermediate layer provided between the vitreous silica outer layer and the vitreous silica inner layer. The vitreous silica outer layer has a mineralizer concentration of 100 ppm or more, and the vitreous silica intermediate layer and the vitreous silica inner layer has a mineralizer concentration of 50 ppm or less. The thickness of the vitreous silica outer layer is 0.5 mm to 2.0 mm on the bottom portion, and the thickness on the sidewall portion of the vitreous silica outer layer is larger than that on the bottom portion.

5 Claims, 4 Drawing Sheets

(51) Int. Cl.
*C30B 29/06* (2006.01)
*C30B 35/00* (2006.01)

(56) References Cited

U.S. PATENT DOCUMENTS

| | | | |
|---|---|---|---|
| 7,299,658 B2 | 11/2007 | Ohama | |
| 2003/0012898 A1* | 1/2003 | Kemmochi et al. | 428/34.4 |
| 2004/0115440 A1 | 6/2004 | Werdecker | |
| 2006/0144327 A1* | 7/2006 | Ohama et al. | 117/200 |
| 2009/0151624 A1* | 6/2009 | Shimazu | 117/208 |

FOREIGN PATENT DOCUMENTS

| | | |
|---|---|---|
| JP | 2000-247778 A | 9/2000 |
| JP | 2004-531449 A | 10/2004 |
| JP | 2005-523229 A | 8/2005 |
| JP | 2006-213556 A | 8/2006 |
| JP | 2008-081374 A | 4/2008 |
| WO | 2004/106247 A1 | 12/2004 |

OTHER PUBLICATIONS

International Search Report mailed Aug. 31, 2010, issued in corresponding International Application No. PCT/JP2010/062682, Jul. 28, 2010, 2 pages.

Chinese Patent Office Notice of First Review and Comments mailed Oct. 22, 2013, issued in corresponding Chinese Application No. 201080033032, filed Jul. 28, 2010, 7 pages.

* cited by examiner

VITREOUS SILICA CRUCIBLE HAVING OUTER, INTERMEDIATE, AND INNER LAYERS

TECHNICAL FIELD

The present invention relates to a vitreous silica crucible used for pulling a silicon single crystal by the Czochralski method (the CZ method), and in particular, relates to a vitreous silica crucible which allows easy taking-out of the used vitreous silica crucible after completion of the pulling.

BACKGROUND ART

A vitreous silica crucible used for pulling a silicon single crystal by the CZ method has become larger along with enlargement of the diameter of the single crystal, and the crucible is exposed to higher temperature environment for a long time, and thus the crucible is required to have high strength. As the solution, for example, Patent Document 1 discloses a technique to enhance the crucible strength by applying a crystallization promoter on the crucible surface to crystallize the crucible surface under high temperature during the pulling process. Furthermore, Patent Document 2 discloses a technique to provide, on the outer surface of the vitreous silica crucible, a stabilization layer having a softening temperature higher than vitreous silica.

Furthermore, Patent Documents 3 and 4 disclose a vitreous silica crucible having three-layer structure which is comprised of an outer layer of an aluminium (Al)-doped silica layer, an intermediate layer of a natural silica layer or high-purity synthetic silica layer, and an inner layer of a transparent high-purity synthetic silica layer. Furthermore, Patent Document 5 discloses a vitreous silica crucible having three-layer structure on the sidewall portion and the curved portion, and having two-layer structure on the bottom portion. The three-layer structure includes an outer layer of crystallization promoter-doped vitreous silica, an opaque intermediate layer of natural vitreous silica, and a transparent inner layer of natural or synthetic vitreous silica. The two-layer structure includes an opaque outer layer of natural vitreous silica, and a transparent inner layer of natural vitreous silica or synthetic vitreous silica. According to the structure, contact between the crucible bottom portion and a susceptor can be enhanced, and thus the crucible can be stably supported.

In the above-mentioned pulling of a silicon single crystal, the vitreous silica crucible is mounted in a susceptor, and the entire crucible is heated, and thereafter the polycrystalline silicon is charged and melted inside the crucible, and a single crystal is pulled therefrom. The inner surface of the vitreous silica crucible contacting the silicon melt corrodes, and thus after single or multiple pulling, a corroded vitreous silica crucible is left in the susceptor. Some silicon melt is left in the used vitreous silica crucible, and when the silicon melt and the crucible are cooled, distortion is generated due to the difference in the thermal expansion coefficient between the crucible and the silicon melt. This distortion damages the crucible and leaves the damaged used crucible together with silicon melt in the susceptor. The damaged used crucible cannot be re-used, and thus is scrapped after taking-out of the susceptor.

In the conventional vitreous silica crucible, when the used crucible is to be taken out of the susceptor, the crucible sometimes adheres to the susceptor, and thus it is difficult to be taken out of the susceptor. In such a case, it is necessary to break the portion adhering to the susceptor by use of a tool, and the handling is difficult for a large-size crucible, and the expensive susceptor is sometimes damaged. Therefore, users have a strong need of a vitreous silica crucible whose can be easily taken out of the susceptor after the pulling.

In order to solve this problem, in Patent Document 6, a crystallization promoting layer is formed so as to form a crystallized layer having a thickness of 0.5 to 2 mm by crystallizing the outer surface at high temperature. This crystallized layer at the crucible sidewall portion is finely crushed during cooling after termination of pulling, and allows easy taking-out of the crucible.

PRIOR ART REFERENCE

Patent Document

Patent Document 1: JP-A-Hei9-110590
Patent Document 2: JP-A-2004-531449
Patent Document 3: JP-A-2000-247778
Patent Document 4: WO2004/106247
Patent Document 5: JP-A-2008-81374
Patent Document 6: JP-A-2006-213556

SUMMARY OF THE INVENTION

Problems to be Solved by the Inventions

As mentioned above, in the conventional vitreous silica crucible described in Patent Document 6, the crystallization promoting layer is formed to be sufficiently thin so that the crystallized layer in the near-surface region is finely crushed, and allows easy taking-out of the crucible from the susceptor. However, because the crystallized layer is very thin, it does not sufficiently reinforce the crucible, unlike a conventional reinforced crucible. As mentioned above, nowadays, a crucible size is enlarged along with enlargement of the diameter of a single crystal, and the crucible is exposed to high temperature for a long time, and thus the crucible is required to have high durability. Therefore, it has been demanded to provide a vitreous silica crucible whose high temperature strength is high, and which allows easy taking-out from a susceptor.

The present invention solve the above-mentioned problem in a conventional vitreous silica crucible used for pulling a silicon single crystal, and provides a vitreous silica crucible whose strength at high temperature during pulling is high, and which allows easy taking-out from a susceptor after completion of pulling.

Means for Solving the Problems

In order to solve the above-mentioned problem, the present inventors have made extensive research, and found out that a thick crystallized layer formed on an outer surface of a crucible can cause cracks extending through the entire wall thickness during cooling after pulling a silicon single crystal, and when such cracks are formed on the crucible bottom portion, those cracks can cause leak, whereas when such cracks are formed on the crucible sidewall portion, those cracks does not cause leak. Furthermore, the inventors have further found out the following points. In order to stably support a crucible, the crucible bottom portion is preferred to slightly deform to closely contact the susceptor. But, when the bottom portion is in close contact with the susceptor, it becomes difficult to take out the crucible from the susceptor, and thus it is important to be able to easily take out the crucible from the susceptor after cooling. However, in the crucible sidewall portion, it is more important to prevent deformation such as inward sagging, and it is less important in the sidewall portion that the crucible can be easily taken out of the susceptor, compared with the bottom portion.

The present invention has been made in view of such technical findings, and the present invention provides a vitreous silica crucible having a sidewall portion, a curved portion (or a corner portion), and a bottom portion, the crucible having a vitreous silica outer layer provided on the outer surface side of the crucible, a vitreous silica inner layer provided on the inner surface side of the crucible, and an vitreous silica intermediate layer provided between the vitreous silica outer layer and the vitreous silica inner layer, the vitreous silica outer layer having a mineralizer concentration of 100 ppm or more, the vitreous silica intermediate layer having a mineralizer concentration of 50 ppm or less, the vitreous silica outer layer having a thickness of 0.5 mm or more and 2.0 mm or less on the bottom portion, and the thickness on the sidewall portion of the vitreous silica outer layer is larger than that on the bottom portion.

According to the present invention, the thickness, on the bottom portion, of the vitreous silica outer layer provided on the crucible outer surface side is 0.5 mm or more and 2.0 mm or less, and in this case, the thickness of the crystallized layer formed on the crucible outer surface side becomes appropriate for crushing during cooling. Therefore, when the crucible is gradually cooled after completion of pulling, cracks are formed on the crystallized layer of the crucible outer surface due to difference in thermal expansion coefficient between vitreous silica and crystalline silica, and thus only the outer surface of the crucible is finely crushed. Therefore, even when the crucible closely contacts the susceptor, it is easy to take out the used crucible from the susceptor. Furthermore, the crystallized layer obtained by crystallizing the vitreous silica outer layer is very thin, and thus this layer does not prevent close contact between the crucible and the susceptor, and thus the crucible can be stably supported.

Furthermore, according to the present invention, the vitreous silica outer layer has a larger thickness on the sidewall portion than that on the bottom portion, and thus the viscosity on the sidewall portion is enhanced, and thus the sidewall portion of the crucible is more resistant to deformation at high temperature during pulling a silicon single crystal.

In the present invention, the vitreous silica outer layer on the sidewall portion is preferred to be 3.0 mm or more. According to this configuration, the viscosity on the sidewall portion is enhanced, and this prevents deformation such as inward sagging of the sidewall portion at high temperature during pulling a silicon single crystal. Unlike the vitreous silica outer layer on the bottom portion, when the vitreous silica outer layer on the sidewall portion is sufficiently thick, cracks extending through the entire wall as well as the surface layer can be formed when the crucible is gradually cooled. However, because silicon melt is scarcely left in the crucible after completion of pulling, leak does not occur even when cracks are formed on the sidewall portion. Therefore, the present invention provides a crucible which allows easy taking-out from the susceptor while preventing leak and crucible deformation.

In the present invention, it is preferred that the average thickness on the sidewall portion of the vitreous silica outer layer is larger than that on the curved portion, and the average thickness on the curved portion of the vitreous silica outer layer is larger than that on the bottom portion. When the thickness of the vitreous silica outer layer is changed stepwise, the possibility of crack formation on the crucible bottom portion is sufficiently reduced. In particular, when the thickness on the curved portion of the vitreous silica outer layer is gradually thinned, the thickness on the sidewall portion of the vitreous silica outer layer can be substantially constant, and thus the function of the vitreous silica outer layer can be stably exhibited on the sidewall portion and the bottom portion.

In the present invention, the vitreous silica inner layer may be a vitreous silica layer having a mineralizer concentration of 20 ppm or less. The vitreous silica layer may be a natural vitreous silica layer having a mineralizer concentration of 20 ppm or less, or may be a synthetic vitreous silica layer having a mineralizer concentration of 1 ppm or less. In any case, the amount of a mineralizer dissolved into silicon melt from the crucible inner surface is scarce, and thus impurity contamination of a silicon single crystal can be suppressed.

In the present invention, the mineralizer is preferred to be Al. When Al is used as a mineralizer, the viscosity of the layer containing Al becomes large, and the crucible strength is enhanced. In addition, heat diffusion at high temperature is small, and thus the thickness of the crystallized layer formed during pulling a silicon single crystal can be easily controlled. Therefore, without being affected by pulling time and conditions of pulling a silicon single crystal, a thin crystallized layer can be stably formed.

In the present invention, it is preferred that the crucible has an opaque vitreous silica layer containing a number of bubbles and provided on the outer surface side of the crucible, and a transparent vitreous silica layer provided on the inner surface side of the crucible, and the opaque vitreous silica layer includes a vitreous silica outer layer and a vitreous silica intermediate layer, and the transparent vitreous silica layer includes a vitreous silica inner layer.

Effect of the Invention

Thus, according to the present invention, there is provided a vitreous silica crucible whose strength at high temperature during pulling is high, and which allows easy taking-out from a susceptor after completion of pulling, and allows safer handling.

DESCRIPTION OF THE PREFERRED EMBODIMENTS

Hereinafter, preferred embodiments of the present invention will be explained with reference to the attached drawings.

Figure 1:
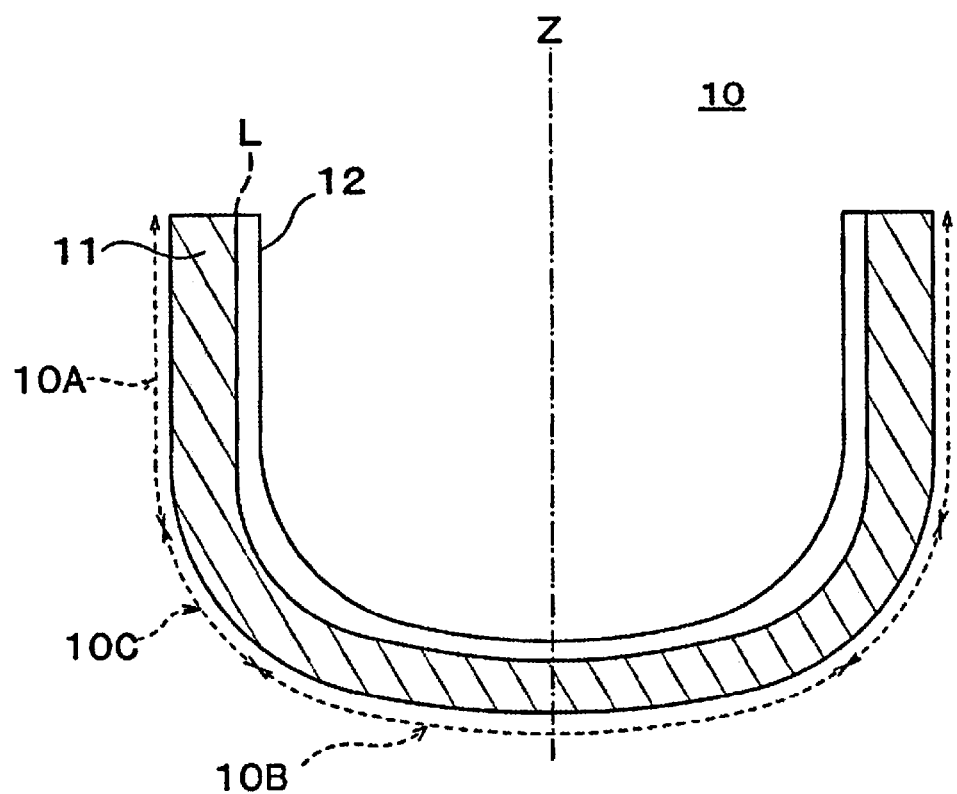
FIG. 1 is a schematic sectional view illustrating structure of a vitreous silica crucible, according to a preferred embodiment of the present invention.

FIG. 1 is a schematic sectional view illustrating structure of a vitreous silica crucible, according to a preferred embodiment of the present invention.

As shown in FIG. 1, a vitreous silica crucible 10 according to the present embodiment has a sidewall portion 10A and a bottom portion 10B, and has a basic shape as a container. The sidewall portion 10A is a cylindrical portion parallel to a crucible central axis (Z axis), and extends substantially vertically from the crucible opening. However, the sidewall portion 10A is not necessarily completely parallel, and it may be gradually widened toward the opening. Furthermore, the sidewall portion 10A may be linear, and may be gradually curved. Although not limiting, the sidewall portion 10A may be defined as a region of a crucible wall whose tangential line has an angle of 80 degrees or more with respect to XY plane which is perpendicular to Z axis.

The crucible bottom portion 10B is a disk-like portion containing a point of intersection with the central axis of the crucible. A curved portion 10C is provided between the bottom portion 10B and the sidewall portion 10A. The curved portion 10C is a portion whose diameter gradually decreases from the sidewall portion 10A. The shape of the bottom portion 10B may have a rounded or flat bottom. The curvature and angle of the curved portion 10C may be set discretionarily. When the crucible bottom portion 10B has a rounded bottom, the bottom portion also has a certain curvature, and thus the difference in curvature between the bottom portion 10B and the curved portion 10C is much smaller compared with the case when the bottom portion 10B has a flat bottom. When the bottom portion 10B has a flat bottom, the bottom portion 10B has a flat or extremely gradually curved surface, and the curvature of the curved portion 10C is very large. In the case of the flat bottom, the bottom portion 10B is defined as a region of a crucible wall whose tangential line has an angle of 30 degrees or less with respect to XY plane which is perpendicular to Z axis.

The wall thickness of the crucible varies depending on the portions, and is preferred to be 10 mm or more, and more preferred to be 13 mm or more. Usually, the wall thickness of a large-size crucible having an opening diameter of 32 inches (about 800 mm) or more is 10 mm or more, and the wall thickness of a large-size crucible having an opening diameter of 40 inches (about 1000 mm) is 13 mm or more. Taking-out of these large-size crucibles from susceptors is very difficult, and they tend to deform because they tends to be used for a long time. Therefore, the effect of the present invention is eminent in such crucibles. In a specific example, the thicknesses of a vitreous silica crucible having a diameter of 32 inches and a height of 500 mm are 17 mm on the sidewall portion, 25 mm on the curved portion, and 14 mm on the bottom portion.

As shown in FIG. 1, the vitreous silica crucible 10 has an opaque vitreous silica layer 11 provided on the crucible outer surface side, and a transparent vitreous silica layer 12 provided on the crucible inner surface side.

The opaque vitreous silica layer 11 is an amorphous vitreous silica layer containing a number of microbubbles. In the present specification, "opaque" refers to a state that a number of bubbles are incorporated in vitreous silica, and looks white and turbid. The opaque vitreous silica layer 11 has a function of uniformly conveying heat from a heater provided on the crucible periphery to silicon melt in the vitreous silica crucible. The opaque vitreous silica layer 11 has larger heat capacity than the transparent vitreous silica layer 12, and thus facilitates control of silicon melt temperature.

The bubble content rate of the opaque vitreous silica layer 11 is higher than that of transparent vitreous silica layer 12, and is not in particular limited as long as the function is exhibited, and is preferred to be 0.7% or more. When the bubble content rate of the opaque vitreous silica layer 11 is less than 0.7%, the function of the opaque vitreous silica layer 11 is not exhibited. The bubble content rate of the opaque vitreous silica layer 11 can be determined from the specific gravity. A piece, of opaque vitreous silica, having a unit volume (1 cm$^3$) is cut out of a crucible, and when the mass is A and the specific gravity of vitreous silica not containing bubbles is B (=2.21), the bubble content rate P (%) is determined by P (%)=(1−A/B)×100.

The transparent vitreous silica layer 12 is an amorphous vitreous silica layer substantially not containing bubbles. The transparent vitreous silica layer 12 prevents increase of vitreous silica pieces detached from the crucible inner surface, and enhances silicon single crystallization yield. Here, "substantially not containing bubbles" means that the bubble content rate and the bubble size are such that the bubbles do not deteriorate the single crystallization yield. The bubble content rate and the average diameter of the bubbles are not in particular limited, and are 0.1% or less and 100 μm or less, respectively. The change in the bubble content rate from the opaque vitreous silica layer 11 to the transparent vitreous silica layer 12 is relatively abrupt. The bubble content rate at a position moved by 30 μm toward the outer surface side from the position at which the bubble content rate of the transparent vitreous silica layer 12 starts to increase is substantially the same as that of the opaque vitreous silica layer 11. Therefore, the border L between the opaque vitreous silica layer 11 and the transparent vitreous silica layer 12 is definite, and can be visually distinguished.

The bubble content rate of the transparent vitreous silica layer 12 can be nondestructively measured by use of an optical detection unit. The optical detection unit may be rotatable so that measurement along the inner surface of the vitreous silica crucible is enabled. Bubbles existing in a certain depth from the surface can be detected by moving the focus of the optical lens from the surface to the depth. The measurement result by the optical detection unit is inputted into an image processing device, and the bubble content rate P (%) is calculated. Specifically, the image of the crucible inner surface is taken by use of an optical camera, and the crucible inner surface is divided into unit areas S1. The area S2 occupied by bubbles is determined for each unit area S1, and the bubble content rate P (%) is calculated from P (%)=(S2/S1)*100. Such nondestructive method of measuring the bubble content rate is detailed in, for example, JP-A-Hei3-86249 and JP-A-Hei11-228283.

Figure 2:
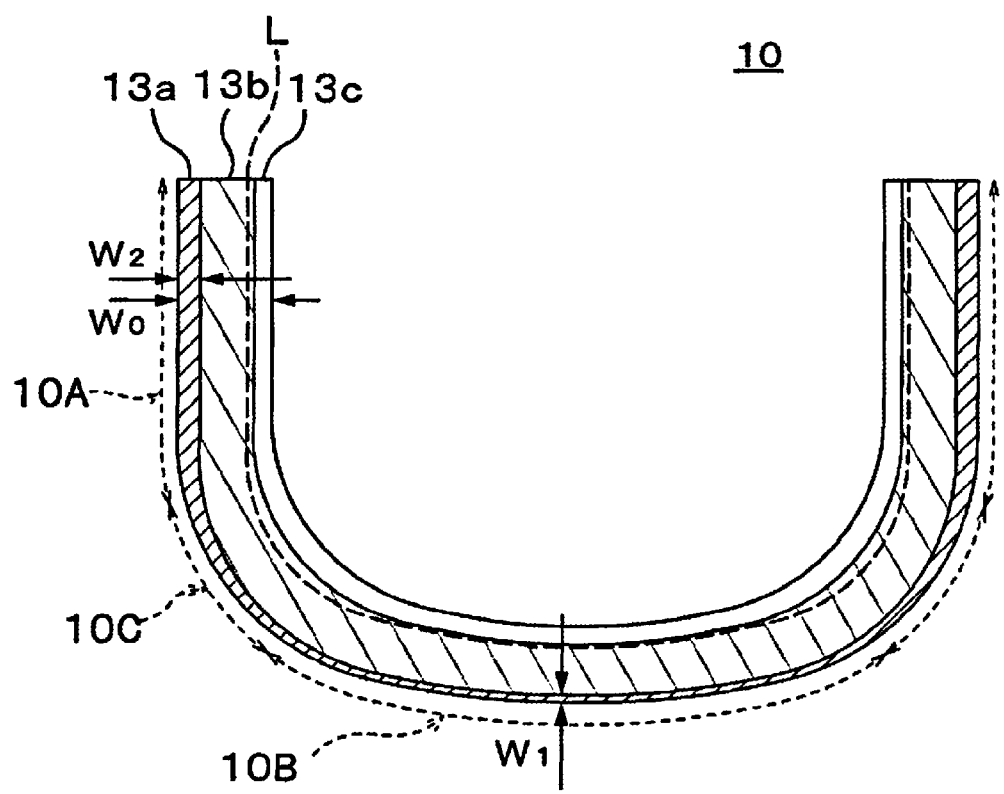
FIG. 2 is a schematic sectional view illustrating layer structure, based on mineralizer concentration, of a vitreous silica crucible according to the present embodiment.

FIG. 2 is a schematic sectional view illustrating layer structure, based on mineralizer concentration, of a vitreous silica crucible according to the present embodiment.

As shown in FIG. 2, the vitreous silica crucible 10 has three-layer structure, and includes, from the crucible outer surface side, a vitreous silica outer layer 13a, a vitreous silica intermediate layer 13b, and a vitreous silica inner layer 13 c. In FIG. 2, the border between the opaque vitreous silica layer 11 and the transparent vitreous silica layer 12 are shown by a doted line L. As shown, the border L between the opaque vitreous silica layer 11 and the transparent vitreous silica layer 12 does not necessarily match the border between the vitreous silica intermediate layer 13b and the vitreous silica inner layer 13 c. Therefore, in the present embodiment, the opaque vitreous silica layer 11 includes a major portion of the vitreous silica outer layer 13a and the vitreous silica intermediate layer 13b, and the transparent vitreous silica layer 12 includes the vitreous silica inner layer 13 c and the rest of the vitreous silica intermediate layer 13b.

The vitreous silica outer layer 13a and the vitreous silica intermediate layer 13b are preferred to be made of natural vitreous silica. Natural vitreous silica is vitreous silica made from natural silica such as silica stone, natural quartz crystal. In general, natural silica has higher metal impurity concentration and lower OH group concentration than synthetic silica. For example, the Al concentration of natural silica is 1 ppm or more, and the concentration of each of alkali metals (Na, K and Li) is 0.05 ppm or more, and the OH group concentration is less than 60 ppm. Whether the material is natural silica or not should not be judged based on a single factor, but should be comprehensively judged based on a plurality of factors. Natural silica has higher high temperature viscosity than synthetic silica, and thus the use of natural silica enhances high temperature strength of the entire crucible. Furthermore, natural material is cheaper than synthetic silica, and thus advantageous in terms of the cost.

The vitreous silica outer layer 13a has a function of improving the crucible strength by enhancing vitreous silica viscosity at high temperature as well as promoting crystallization (cristobalite formation) on the crucible outer surface. In order to realize such function, the average concentration of the mineralizer contained in the vitreous silica outer layer 13a is required to be 100 ppm or more. When the average concentration of the mineralizer is less than 100 ppm, the crucible outer surface is not crystallized or crystallization is insufficient, and thus the outer layer might not function as a crystallization promoting layer.

The kind of the mineralizer added to silica powder is not in particular limited as long as the mineralizer promotes crystallization of the vitreous silica. The kind of the mineralizer is preferably metal impurities, because metal impurities particularly promote crystallization. The kind of the mineralizer is, for example, alkali metal (e.g. sodium or potassium), alkali earth metal (magnesium, calcium, strontium, or barium), aluminium, iron.

When Al is used as a mineralizer, the viscosity of the layer containing Al becomes large, and the crucible strength is enhanced. In addition, heat diffusion at high temperature is small, and thus the thickness of the crystallized layer formed during pulling a silicon single crystal can be easily controlled. Therefore, without being affected by pulling time and conditions of pulling a silicon single crystal, a thin crystallized layer can be stably formed.

The vitreous silica intermediate layer 13b is necessary to obtain a crucible having a desired wall thickness. Furthermore, the vitreous silica intermediate layer 13b prevents the vitreous silica inner layer 13c from being contaminated by material powder, for the vitreous silica outer layer 13a, containing a large amount of mineralizer when the material powder is moved by an irregular flow of arc flame during fusing silica powder. Furthermore, the vitreous silica intermediate layer 13b functions as an intermediate layer to prevent distortion by internal stress caused by the difference in the mineralizer concentration. It is possible to prevent the crucible from being damaged during cooling by alleviating the internal stress by providing an outer layer having high mineralizer concentration, a high-purity inner layer having low mineralizer concentration, and an intermediate layer, between the outer layer and the inner layer, whose aluminium concentration gradually decreases.

Unlike the vitreous silica outer layer 13a, the vitreous silica intermediate layer 13b is required not to be crystallized at high temperature during pulling a single crystal. For this reason, the average mineralizer concentration contained in the vitreous silica intermediate layer 13b is required to be 50 ppm or less. According to this configuration, the difference in the mineralizer concentration is suitably set, and thus the border between vitreous silica and crystalline silica can be clearly determined.

The vitreous silica outer layer 13a is formed on the entire outer surface of the crucible, but the thickness is different between portions. In the present embodiment, the vitreous silica outer layer 13a is relatively thick on the crucible sidewall portion 10A, and relatively thin on the bottom portion. Specifically, the thickness $W_1$ on the bottom portion 10B of the vitreous silica outer layer 13a is 0.5 mm or more and 2.0 mm or less, and the thickness $W_2$ on the sidewall portion 10A of the vitreous silica outer layer 13a is 3.0 mm or more and thicker than $W_1$. Specifically, $W_1$=2.0 mm, and $W_2$=4.0 mm.

The thickness $W_1$ on the bottom portion 10B of the vitreous silica outer layer 13a is required to be 0.5 mm or more and 2.0 mm or less. When the thickness of the vitreous silica outer layer 13a is less than 0.5 mm, the crushing effect cannot be sufficiently obtained. When the thickness is larger than 2 mm, there is a risk that crushing occurs too much, and the crucible collapse during cooling and leak occurs.

The thickness $W_2$ on the sidewall portion 10A of the vitreous silica outer layer 13a is 3 mm or more, and preferred to be 4 mm or more. Furthermore, the thickness $W_2$ is preferred to be ½ or less of the wall thickness $W_0$ of the crucible sidewall portion 10A ($W_0$/2 or less). In this case, $W_0 \geq 10$ mm is preferred. When the thickness of the vitreous silica outer layer 13a is larger than ½ of the wall thickness $W_0$ of the sidewall portion 10A, the vitreous silica intermediate layer 13b is thinned, and thus the mineralizer blocking effect becomes insufficient, and then the mineralizer compound of the vitreous silica outer layer 13a can mix in the vitreous silica inner layer 13c through the vitreous silica intermediate layer 13b, to increase the mineralizer concentration of the high-purity vitreous silica inner layer 13c. When the thickness of the vitreous silica outer layer 13a is 4 mm or more, the thickness on the sidewall portion 10A of the vitreous silica outer layer 13a is clearly different from that on the crucible bottom portion 10B, and thus deformation of the sidewall portion 10A can be sufficiently suppressed.

It is preferred that the thickness of the vitreous silica outer layer 13a is generally constant on the sidewall portion 10A, and gradually decreases on the curved portion 10C, and becomes constant on the bottom portion with a thickness of 0.5 mm or more and 2.0 mm or less. In this case, the thickness on the sidewall portion 10A of the vitreous silica outer layer 13a is larger than the average thickness on the curved portion 10C of the vitreous silica outer layer 13a. Furthermore, the thickness on the curved portion 10C of the vitreous silica outer layer 13a is larger than that on the bottom portion 10B of the vitreous silica outer layer 13a. However, the present invention is not limited to the configuration where the thickness of the vitreous silica outer layer 13a gradually decreases from the curved portion 10C, but, when the vitreous silica outer layer 13a has a sufficient thickness on the sidewall portion 10A, the vitreous silica outer layer 13a may be configured so that the thickness decreases from a certain point of the sidewall portion 10A.

The vitreous silica outer layer 13a is crystallized at high temperature during pulling a single crystal. The vitreous silica outer layer 13a is thin on the bottom portion 13B, and thus when the crucible is gradually cooled after completion of pulling a single crystal, cracks are formed in the crystallized layer on the crucible outer surface due to difference in the thermal expansion coefficient between vitreous silica and crystalline silica, and thus only the outer surface of the crucible is finely crushed. Therefore, even when the crucible is closely attached to a susceptor, it is easy to take out the used crucible from the susceptor. Furthermore, the crystallized layer is very thin, and thus the vitreous silica intermediate layer 13b is not damaged by the stress due to the difference in the thermal expansion coefficient between vitreous silica and crystalline silica, and in addition the close contact between the crucible and the susceptor is not prevented, and leak caused by the damage of the crucible bottom portion does not occur.

When the vitreous silica outer layer 13a is thick on the sidewall portion 13A, the viscosity of the sidewall portion 10A can be enhanced and the deformation such as inward sagging of the sidewall portion 10A can be prevented at high temperature during pulling a silicon single crystal. Furthermore, when the crucible is gradually cooled after completion of pulling a single crystal, cracks are formed in the crystallized layer on the crucible outer surface due to difference in the thermal expansion coefficient between vitreous silica and crystalline silica, and thus only the outer surface of the crucible is crushed. Therefore, even when the crucible is closely attached to a susceptor, it is easy to take out the used crucible from the susceptor. Unlike the crucible bottom portion 10B, when the crystallized layer is thick, the remaining vitreous silica layer becomes thin, and thus the stress due to the difference in the thermal expansion coefficient between vitreous silica and crystalline silica is large, and thus the vitreous silica intermediate layer 13b can be damaged. However, silicon melt is scarcely left in the crucible after completion of pulling, and thus leak does not occur even when cracks are formed on the sidewall portion 10A.

The vitreous silica inner layer 13c decreases the amount of impurity dissolved from the crucible inner surface, and serves to suppress impurity contamination of a silicon single crystal. Therefore, the mineralizer concentration of the vitreous silica inner layer 13c is preferred to be as low as possible. The raw material of the vitreous silica inner layer 13c is preferred to be high-purity natural vitreous silica or synthetic vitreous silica. Synthetic vitreous silica is vitreous silica manufactured by fusing synthetic material synthesized by, for example, hydrolysis of silicon alkoxide. In general, synthetic silica has lower metal impurity concentration and higher OH group concentration than natural silica. For example, the concentration of each of metal impurities contained in synthetic silica is less than 0.05 ppm, and the OH group concentration is 30 ppm or more. However, there is also known synthetic silica to which metal impurities are added, and thus whether the material is synthetic silica or not should not be judged based on a single factor, but should be comprehensively judged based on a plurality of factors. As such, synthetic vitreous silica contains less impurities than natural vitreous silica, and thus can prevent increase of impurities dissolved into silicon melt from the crucible, and thus enhance the silicon single crystallization yield.

As explained above, according to the present embodiment, the thickness, on the bottom portion 10B, of the vitreous silica outer layer 13a provided on the crucible outer surface side is 0.5 mm or more and 2.0 mm or less, and in this case, the thickness of the crystallized layer formed on the crucible outer surface side becomes appropriate for crushing during cooling. Therefore, when the crucible is gradually cooled after completion of pulling, cracks are formed on the crystallized layer of the crucible outer surface due to difference in thermal expansion coefficient between vitreous silica and crystalline silica, and thus only the outer surface of the crucible is finely crushed. Therefore, even when the crucible closely contacts the susceptor, it is easy to take out the used crucible from the susceptor.

Furthermore, according to the present embodiment, the vitreous silica outer layer 13a provided on the outer surface is thick on the sidewall portion 10A, and thus the viscosity of the sidewall portion 10A can be enhanced and the deformation such as inward sagging of the sidewall portion 10A can be prevented at high temperature during pulling a silicon single crystal.

Unlike a sufficiently thin layer provided on the bottom portion 10B, the vitreous silica outer layer 13a provided on the sidewall portion is a relatively thick layer, and thus cracks extending through the entire wall of the sidewall portion 10A as well as the surface layer can be formed when the crucible is gradually cooled. However, because silicon melt is scarcely left in the crucible after completion of pulling, leak does not occur even when such cracks are formed. Therefore, the present embodiment provides a crucible which allows easy taking-out from the susceptor while preventing leak and crucible deformation.

Next, with reference to FIG. 3 and FIG. 4, a method of manufacturing a vitreous silica crucible 10 will be explained in detail.

Figure 3:
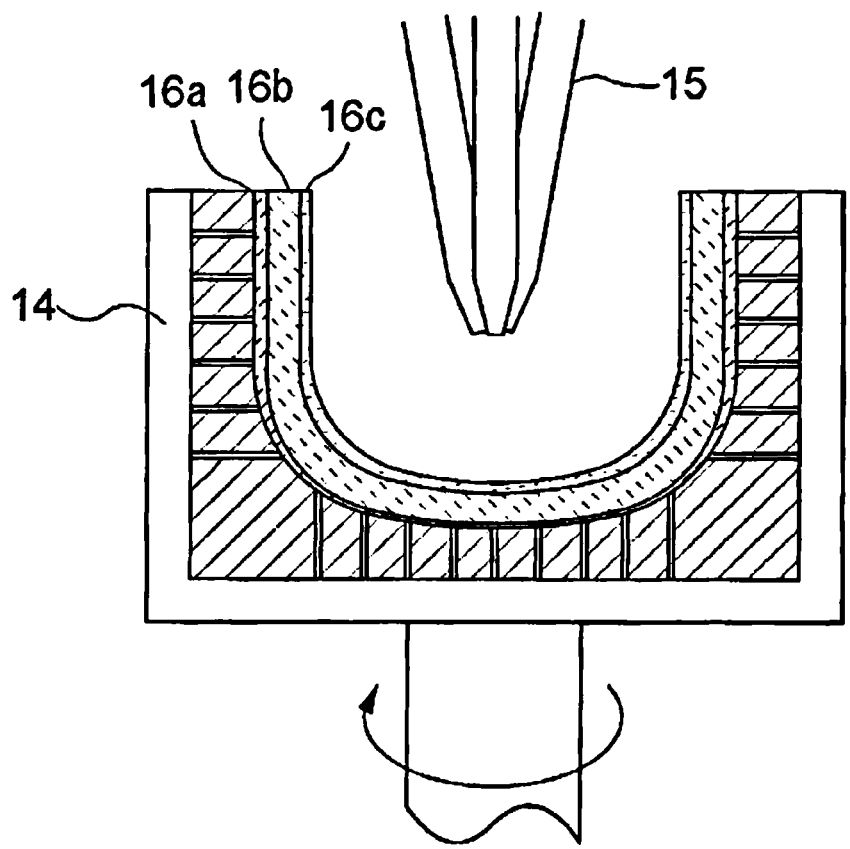
FIG. 3 is a schematic view for explaining a method of manufacturing a vitreous silica crucible 10.
Figure 4:
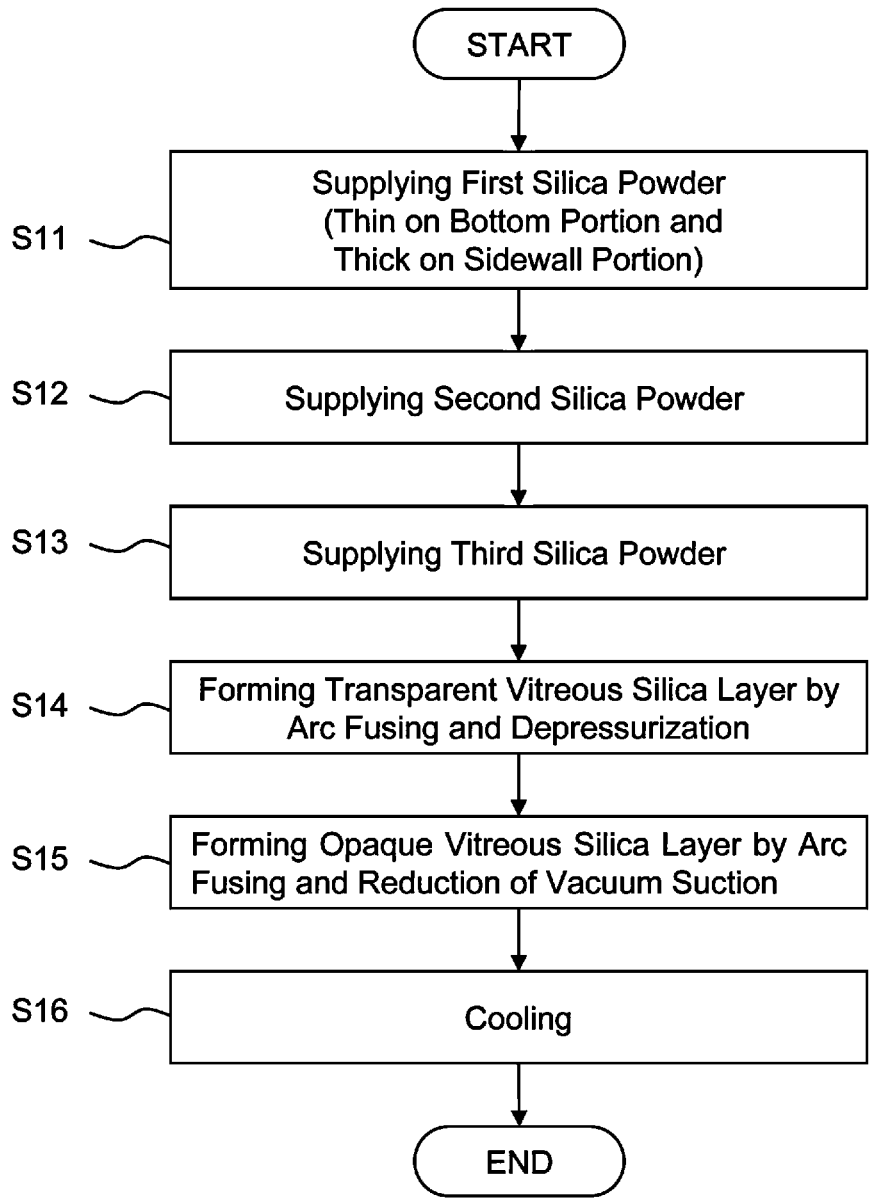
FIG. 4 is a flowchart schematically illustrating a method of manufacturing a vitreous silica crucible 10.

FIG. 3 is a schematic view illustrating a method of manufacturing the vitreous silica crucible 10. FIG. 4 is a flowchart schematically illustrating a method of manufacturing the vitreous silica crucible 10.

The vitreous silica crucible 10 can be manufactured by use of the rotating mold method. In the rotating mold method, as shown in FIG. 3, a carbon mold 14 having a cavity corresponding to the outer shape of the vitreous silica crucible 10 is prepared, and silica powder is supplied to the mold 14 while rotating the mold 14 to form a silica powder layer along the inner surface of the mold.

In the present embodiment, first, natural silica powder (first natural silica powder 16a) as a raw material of the vitreous silica outer layer 13a is supplied into the cavity (Step S11). At this stage, the supplied amount of the first natural silica powder 16a is adjusted so that the final thickness of the vitreous silica outer layer 13a becomes 3 mm or more on the sidewall portion 10A, and 0.5 to 2 mm on the bottom portion 10B. The mineralizer concentration of the first natural silica powder 16a can be adjusted by, for example, mixing alumina powder in the material silica powder.

Next, natural silica powder (second natural silica powder 16b) as the material of the vitreous silica intermediate layer 13b is supplied, and thereafter natural silica powder or synthetic silica powder (third silica powder 16c) as the material of the vitreous silica inner layer 13c is supplied (Steps S12, S13). The supplied amount of the third silica powder 16c is adjusted so that the final thickness of the vitreous silica inner layer 13c becomes a suitable thickness which is 1 mm or more. Furthermore, the supplied amount of the second silica powder 16b can be adjusted so that the final crucible wall thickness containing the vitreous silica outer layer 13a and the vitreous silica inner layer 13c has a suitable thickness. The carbon mold 14 rotates at a constant rate, and the supplied silica powder is retained on a specific position in the inner surface of the mold 19 by the centrifugal force, and the shape is maintained.

Thereafter, arc electrodes 15 are placed in the cavity, and the entire silica powder layer is heated and fused at 1720 degrees C. or more from the inside of the mold. Furthermore, during heating, the silica powder layer is depressurized from the mold side, to suction gas inside the silica powder layer toward the outer layer side through the ventilation holes provided on the mold. The bubbles in the crucible inner surface are removed by deaerating the silica powder layer during heating, to form a transparent vitreous silica layer 12 substantially not containing bubbles (Step S14). Thereafter, the depressurization for deaeration is weakened or stopped while heating and leaves bubbles to obtain an opaque vitreous silica layer 11 containing a number of microbubbles (Step S15). Finally, the heating is stopped, and the crucible is cooled (Step S16), to obtain the vitreous silica crucible of the present embodiment.

As mentioned above, the preferred embodiments of the present invention have been described. The present invention is not in particular limited to the above-mentioned embodiments, and various modifications are possible as long as the modification does not depart from the spirit of the present invention.

For example, in the above-mentioned method of manufacturing a vitreous silica crucible, the entire crucible including the vitreous silica outer layer 13a is formed by the rotating mold method, but the vitreous silica outer layer 13a on the crucible bottom portion 10B may be formed by the thermal spraying method. The vitreous silica outer layer 13a on the sidewall portion 10A is preferred to be formed by the arc fusing method because of the large thickness thereof. When the vitreous silica outer layer 13a on the bottom portion 10B is formed by the thermal spraying method, it is possible to form a vitreous silica layer having a very thin uniform thickness of 0.5 to 2 mm.

EXAMPLE

Example 1

A vitreous silica crucible having a three-layer structure as shown in FIG. 2 was manufactured by the rotating mold method to prepare crucible samples A1 to A5 whose thickness of the vitreous silica outer layer 13a is different from one another. The vitreous silica crucible samples A1 to A5 were prepared to have a diameter of 32 inches (opening diameter of 800 mm), a height of 500 mm, and thicknesses of 17 mm on the sidewall portion, 25 mm on the curved portion, and 14 mm on the bottom portion. The thicknesses of the vitreous silica inner layer 13c were 1.5 mm on the sidewall portion and 1.0 mm on the bottom portion. Furthermore, the Al concentration of the vitreous silica outer layer 13a was 100 ppm in all samples, and the Al concentration of the vitreous silica intermediate layer 13b was 50 ppm in all samples.

Then, pulling of a silicon single crystal was carried out by use of these vitreous silica crucible samples. In pulling a silicon single crystal, 400 kg of material polysilicon was charged into the vitreous silica crucible, and the vitreous silica crucible was mounted on a single crystal puller. Thereafter, the polysilicon in the crucible was melted in the furnace to pull a silicon single crystal ingot having a diameter of about 300 mm by so-called "recharging method". Then, after completion of pulling a silicon single crystal, the furnace inside was cooled from about 1500 degrees C. to 400 degrees C. over 12 hours. The crucible cooling rate was about 92 degrees C./hour. Thereafter, the crucible was taken out of the furnace, and the state of the crucible cooled to the room temperature was observed. The results are shown in Table 1.

As shown in Table 1, as to the vitreous silica crucible samples A2 and A3, the crucible outer surface was completely crystallized, and even after pulling was carried out three times by the recharging method, the crucible maintained sufficient strength, and after cooling, the outer surface on the crucible bottom portion was finely crushed, and thus it was extremely easy to take out the used crucible. There were cracks on the sidewall portion, but no deformation such as inward sagging was observed.

In contrast, as to the vitreous silica crucible sample A1, the crystallized layer on the crucible bottom portion was insufficient, and the crystallized layer was hardly crushed during cooling, and it was very difficult to take out the used crucible. Furthermore, as to the vitreous silica crucible sample A4, the outer surface on the crucible bottom portion and the sidewall portion was completely crystallized. However, when pulling was carried out three times by the recharging method, deformation by inward sagging of the crucible sidewall portion was observed. After cooling, the outer surface on the crucible bottom portion was finely crushed, and thus it was extremely easy to take out the used crucible. Furthermore, as to the vitreous silica crucible sample A5, the crucible outer surface was completely crystallized, and even after pulling was carried out three times by the recharging method, the crucible maintained sufficient strength. However, leak occurred due to crack formed on the bottom portion during cooling after completion of pulling.

TABLE 1

| Crucible Sample | Outer Layer Thickness (mm) | | State after Cooling | | Evaluation |
|---|---|---|---|---|---|
| | Bottom Portion | Sidewall Portion | Bottom Portion | Sidewall Portion | |
| A1 | 0.1 | 4 | Crystallized Layer Not Crushed | Cracks Formed, Inward Sagging Not Occur | NG |
| A2 | 0.5 | 4 | Crystallized Layer Finely Crushed and Detached | Cracks Formed, Inward Sagging Not Occur | OK |
| A3 | 2 | 4 | Crystallized Layer Finely Crushed and Detached | Cracks Formed, Inward Sagging Not Occur | OK |
| A4 | 2 | 2 | Crystallized Layer Finely Crushed and Detached | Cracks Not Formed, Inward Sagging Occurred | NG |
| A5 | 4 | 4 | Crystallized Layer Not Crushed | Cracks Formed, Inward Sagging Not Occur | NG |

Example 2

A vitreous silica crucible having three-layer structure as shown in FIG. 2 was manufactured by the rotating mold method to prepare crucible samples B1 to B4 to satisfy the same conditions as the sample A3 except that the Al concentration on the vitreous silica outer layer 13a was different. Therefore, the thickness of the vitreous silica outer layer 13a was 2 mm on the bottom portion 10B, and 4 mm on the sidewall portion 10A.

Then, pulling of a silicon single crystal was carried out by use of these vitreous silica crucible samples B1 to B4. The results are shown in Table 2.

As shown in Table 2, as to the vitreous silica crucible samples B1 and B2, the crucible outer surface was completely crystallized, and even after pulling was carried out three times by the recharging method, the crucible maintained sufficient strength, and after cooling, the crucible outer surface was finely crushed, and thus it was extremely easy to take out the used crucible. There were cracks on the sidewall portion, but no deformation such as inward sagging was observed.

In contrast, as to the vitreous silica crucible samples B3 and B4, the crucible was crushed during cooling at normal cooling rate, and thus long time was required for cooling to avoid collapse of the crucible.

TABLE 2

| Crucible Sample | Vitreous Silica Outer Layer Al Concentration ppm | Vitreous Silica Intermediate Layer Al Concentration ppm | State after Cooling | Evaluation |
|---|---|---|---|---|
| B1 | 125 | 50 | Crystallized Layer Finely Crushed and Detached | OK |
| B2 | 100 | 50 | Crystallized Layer Finely Crushed and Detached | OK |
| B3 | 75 | 50 | Crystallized Layer Not Crushed | NG |
| B4 | 50 | 50 | Crystallized Layer Not Crushed | NG |

Example 3

A vitreous silica crucible having a three-layer structure as shown in FIG. 2 was manufactured by the rotating mold method to prepare crucible samples C1 to C2 to satisfy the same conditions as the sample A3 except that Ba or Ca was used as a mineralizer instead of Al.

Then, pulling of a silicon single crystal was carried out by use of these vitreous silica crucible samples C1 to C2. The results are shown in Table 3.

TABLE 3

| | | State after Cooling | | |
|---|---|---|---|---|
| Crucible Sample | Mineralizer | Bottom Portion | Sidewall Portion | Evaluation |
| C1 | Ba | Crystallized Layer Finely Crushed and Detached | Cracks Formed, Inward Sagging Not Occur | OK |
| C2 | Ca | Crystallized Layer Finely Crushed and Detached | Cracks Formed, Inward Sagging Not Occur | OK |

As shown in Table 3, as to the vitreous silica crucible samples C1 and C2, the crucible outer surface was completely crystallized, and even after pulling was carried out three times by the recharging method, the crucible maintained sufficient strength, and after cooling, the crucible outer surface was finely crushed, and thus it was extremely easy to take out the used crucible. There were cracks on the sidewall portion.

Inward sagging did not occur, but the amount of sidewall lowering was slightly larger than A3.

EXPLANATION OF REFERENCE SYMBOL

10 the Vitreous Silica Crucible
10A Sidewall Portion
10B Bottom Portion
10C Curved portion
11 Opaque Vitreous Silica Layer
12 Transparent Vitreous Silica Layer
13a Vitreous Silica Outer Layer
13b Vitreous Silica Intermediate Layer
13c Vitreous Silica Inner Layer
14 Carbon Mold
15 Arc Electrode
16a First Silica Powder
16b Second Silica Powder
16c Third Silica Powder

The invention claimed is:

1. A vitreous silica crucible having a sidewall portion, a curved portion, and a bottom portion,
    the crucible having a vitreous silica outer layer provided on the outer surface side of the crucible, a vitreous silica inner layer provided on the inner surface side of the crucible, and a vitreous silica intermediate layer provided between the vitreous silica outer layer and the vitreous silica inner layer,
    the vitreous silica outer layer having a mineralizer concentration of 100 ppm or more,
    the vitreous silica intermediate layer having a mineralizer concentration of 50 ppm or less,
    the vitreous silica outer layer and the vitreous silica inner layer having a thickness of 0.5 mm or more and 2.0 mm or less on the bottom portion, respectively,
    the thickness on the sidewall portion of the vitreous silica outer layer is larger than that on the bottom portion,
    the vitreous silica outer layer is an opaque vitreous silica layer with a bubble content rate of 0.7% or more, and
    the vitreous silica inner layer is a transparent vitreous silica layer with a bubble content rate of 0.1% or less;
    wherein the average thickness on the sidewall portion of the vitreous silica outer layer is larger than that on the curved portion of the vitreous silica outer layer, and the average thickness on the curved portion of the vitreous silica outer layer is larger than that on the bottom portion of the vitreous silica outer layer.

2. The vitreous silica crucible of claim 1, wherein the thickness on the sidewall portion of the vitreous silica outer layer is 3.0 mm or more.

3. The vitreous silica crucible of claim 1, wherein the vitreous silica inner layer has a mineralizer concentration of 20 ppm or less.

4. The vitreous silica crucible of claim 1, wherein the thickness of the vitreous silica outer layer is substantially constant on the sidewall portion, and gradually decreases on the curved portion toward the bottom portion.

5. The vitreous silica crucible of claim 1, wherein the mineralizer is Al.

\* \* \* \* \*